(12) United States Patent
Sankaran et al.

(10) Patent No.: US 12,727,483 B2
(45) Date of Patent: Sep. 1, 2026

(54) INTEGRATED CIRCUIT BACKSIDE RADIATION/RESONATOR

(71) Applicant: TEXAS INSTRUMENTS INCORPORATED, Dallas, TX (US)

(72) Inventors: Swaminathan Sankaran, Allen, TX (US); Adam Fruehling, Garland, TX (US); Baher Haroun, Allen, TX (US); Scott Robert Summerfelt, Garland, TX (US); Benjamin Stassen Cook, Los Gatos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 91 days.

(21) Appl. No.: 17/732,822

(22) Filed: Apr. 29, 2022

(65) Prior Publication Data

US 2022/0406738 A1 Dec. 22, 2022

Related U.S. Application Data

(60) Provisional application No. 63/213,527, filed on Jun. 22, 2021.

(51) Int. Cl.
*H01L 23/66* (2006.01)
*H01Q 1/22* (2006.01)
(Continued)

(52) U.S. Cl.
CPC .......... *H10W 44/20* (2026.01); *H01Q 1/2283* (2013.01); *H01Q 9/0407* (2013.01); *H10W 44/248* (2026.01)

(58) Field of Classification Search
CPC ..... H01L 2223/6627; H01L 2223/6677; H01L 23/5227; H01L 23/66; H01Q 1/2283;
(Continued)

(56) References Cited

U.S. PATENT DOCUMENTS 6,258,697 B1 7/2001 Bhakta
6,287,931 B1 9/2001 Chen
(Continued)

FOREIGN PATENT DOCUMENTS

EP 0966040 A1 12/1999
KR 20070110743 A 11/2007

OTHER PUBLICATIONS

International Search Report for PCT/US2022/034217 dated Oct. 13, 2022; 3 pages.
(Continued)

*Primary Examiner* — Thien M Le

(74) *Attorney, Agent, or Firm* — Zhenhai Fu; Frank D. Cimino

(57) ABSTRACT

An integrated circuit (IC) includes a semiconductor substrate having a first surface and a second surface opposite the first surface. A through wafer trench (TWT) extends from the first surface of the semiconductor substrate to the second surface of the semiconductor substrate. Dielectric material is in the TWT. An interconnect region has layers of dielectric on the first surface of the substrate. The interconnect region has a conductive transmit patch. An antenna is formed, at least in part, by the dielectric material in the TWT and the transmit patch in the interconnect region. The antenna is configured to transmit or receive electromagnetic radiation between the transmit patch and the second surface of the semiconductor substrate through the dielectric material within the trench.

30 Claims, 8 Drawing Sheets

(51) Int. Cl.
*H01Q 9/04* (2006.01)
*H10W 44/20* (2026.01)

(58) Field of Classification Search
CPC .... H01Q 19/10; H01Q 21/065; H01Q 9/0407; H01Q 9/0414; H01Q 9/0485
See application file for complete search history.

(56) References Cited

U.S. PATENT DOCUMENTS

| | | | | |
|---|---|---|---|---|
| 7,309,659 | B1 | 12/2007 | Subramanian | |
| 8,933,473 | B1 | 1/2015 | Dubin | |
| 9,419,075 | B1 | 8/2016 | Carothers | |
| 9,887,165 | B2 * | 2/2018 | Pagani | H01L 21/76224 |
| 10,199,461 | B2 | 2/2019 | Carothers | |
| 10,331,993 | B1 * | 6/2019 | Koepp | G06K 19/07754 |
| 11,423,278 | B1 * | 8/2022 | Koepp | H01L 21/76802 |
| 2002/0086585 | A1 | 7/2002 | Butaye | |
| 2002/0113037 | A1 | 8/2002 | Wu | |
| 2005/0133837 | A1 | 6/2005 | Hsu | |
| 2006/0177979 | A1 | 8/2006 | Tu | |
| 2007/0075445 | A1 | 4/2007 | Gogoi | |
| 2008/0217659 | A1 | 9/2008 | Hung | |
| 2008/0258238 | A1 | 10/2008 | Rogers | |
| 2011/0175152 | A1 | 7/2011 | Booth, Jr. | |
| 2012/0267753 | A1 | 10/2012 | Yeh | |
| 2013/0264688 | A1 | 10/2013 | Qian | |
| 2014/0124845 | A1 | 5/2014 | Cheng | |
| 2014/0342527 | A1 | 11/2014 | Steeneken | |
| 2014/0361401 | A1 | 12/2014 | Wang | |
| 2015/0069520 | A1 | 3/2015 | Lee | |
| 2015/0115342 | A1 | 4/2015 | Kaya | |
| 2015/0206861 | A1 | 7/2015 | Dubin | |
| 2016/0072182 | A1 * | 3/2016 | Wang | H01Q 1/2283 343/834 |
| 2016/0218175 | A1 | 7/2016 | Carothers | |
| 2017/0117356 | A1 | 4/2017 | Carothers | |
| 2017/0125407 | A1 | 5/2017 | Schulze | |
| 2017/0345714 | A1 * | 11/2017 | Scharf | H01L 24/36 |
| 2018/0123251 | A1 * | 5/2018 | Wang | H01Q 9/0471 |
| 2018/0190580 | A1 | 7/2018 | Haba | |
| 2018/0294545 | A1 * | 10/2018 | Xue | H01Q 13/106 |
| 2019/0157137 | A1 | 5/2019 | Desbonnets | |
| 2020/0058581 | A1 | 2/2020 | El-Hinnawy | |
| 2020/0203290 | A1 | 6/2020 | Summerfelt | |
| 2021/0305158 | A1 * | 9/2021 | Wagner | H01L 23/585 |
| 2022/0093429 | A1 * | 3/2022 | Chen | H01J 37/32972 |
| 2022/0223564 | A1 | 7/2022 | Chen et al. | |
| 2023/0142196 | A1 * | 5/2023 | Seol | H01Q 1/2283 257/737 |
| 2023/0144206 | A1 * | 5/2023 | Dogiamis | H01Q 1/526 257/774 |
| 2024/0006381 | A1 * | 1/2024 | Morein | H01L 25/50 |

OTHER PUBLICATIONS

Written Opinion for PCT/US2022/034217 dated Oct. 13, 2022; 4 pages.

European Patent Office, Extended European Search report for T100899EP01, dated Sep. 9, 2024, 7 pages.

United States Patent and Trademark Office, Office Action for U.S. Appl. No. 17/681,029, mailed Sep. 20, 2024, 21 pages.

Final Office Action in corresponding U.S. Appl. No. 17/680,981, issued Jan. 7, 2026, 15 pgs.

* cited by examiner

INTEGRATED CIRCUIT BACKSIDE RADIATION/RESONATOR

CROSS-REFERENCE TO RELATED APPLICATION

This application claims priority to U.S. Provisional Application No. 63/213,527, filed Jun. 22, 2021, which is hereby incorporated by reference.

BACKGROUND

Integrated circuits (ICs) are used for a variety of reasons. Often, an IC generates signals that are transmitted from (or received by) the IC to a device external to the IC. A variety of connection schemes are available to connect the IC to a circuit board, and thus through the circuit board to other devices. Examples of such connection schemes include solder bumps and bond wires. At lower frequencies, such connection schemes are satisfactory. However, at higher frequencies (e.g., greater than 100 GHz), the transition impedance of solder bumps and bond wires becomes problematic for the effective transfer of electric signals.

SUMMARY

In one example, an integrated circuit (IC) includes a semiconductor substrate having a first surface and a second surface opposite the first surface. A through wafer trench (TWT) extends from the first surface of the semiconductor substrate to the second surface of the semiconductor substrate. Dielectric material is in the TWT. An interconnect region has layers of dielectric on the first surface of the substrate. The interconnect region has a conductive transmit patch. An antenna is formed, at least in part, by the dielectric material in the TWT and the transmit patch in the interconnect region. The antenna is configured to transmit (or receive) electromagnetic radiation from the transmit patch, through the dielectric material within the trench, and out the second surface of the semiconductor substrate.

DETAILED DESCRIPTION

Figure 1:
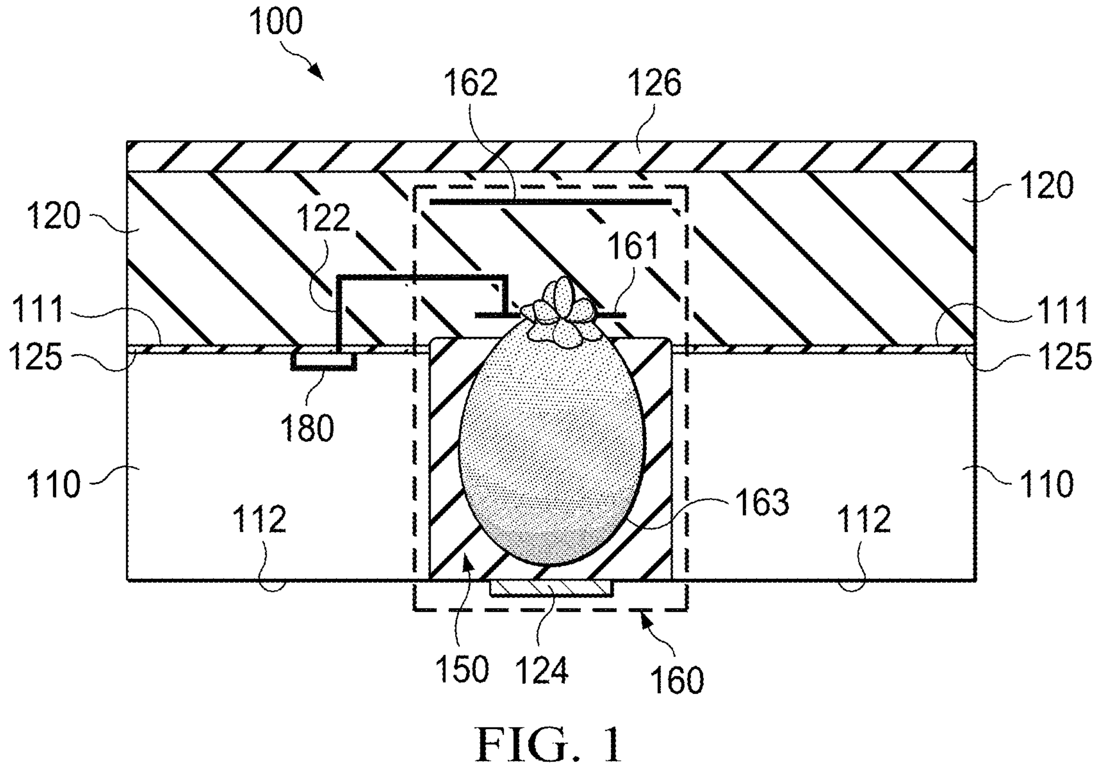
FIG. 1 is a cross-sectional view of an integrated circuit (IC) including a back-side radiating antenna in accordance with an example.

FIG. 1 is a cross-sectional view of an integrated circuit (IC) 100 that has a back-side radiating antenna in accordance with an example. The IC 100 has a semiconductor substrate 110. The semiconductor substrate 110 has a first surface 111 and a second surface 112 opposite the first surface 111. The IC 100 100 also has a through wafer trench (TWT) 150 extending from the first surface 111 of the semiconductor substrate 110 to the second surface 112 of the semiconductor substrate.

A dielectric material is disposed in the TWT 150. As will be further described below, the dielectric-filled TWT 150 forms part of an antenna 160. Antenna 160 is usable to transmit and/or receive wireless signals to/from a device external to IC 100. A circuit 180 formed in or on the substrate 110 generates signals to be transmitted by antenna 160 to an external device and/or receives and processes signals received by antenna 160 from an external device.

The dielectric fill material of antenna 160 may have a relatively low loss tangent with a suitable dielectric constant to the frequency of operation of the antenna. In one example, the dielectric fill material of antenna 160 is fluorinated parylene (parylene-F or -HTC or -AF4). In other examples, the dielectric fill material may be a non-fluorinated parylene compound. In other examples, the dielectric fill material may include organic dielectric material such as epoxy, polyimide, silicone, Teflon, or benzocyclobutene (BCB). Alternately, the dielectric fill material 110 may include inorganic dielectric material such as glass, ceramic or silicon dioxide-based inorganic material formed from siloxane-containing solution or sol-gel.

The IC 100 also includes an interconnect region 120 (also called a Back End of Line, BEOL) having layers of dielectric (e.g., silicon dioxide, SiO2) and metal (metal layers and vias) disposed on the first surface 111 of the substrate 110. A thin layer of silicon nitride (SiN) 125 is disposed between the dielectric of the interconnect region 120 and the semiconductor substrate 110. Another SiN layer 126 is formed on the surface of the interconnect region 120 opposite the substrate 110. The interconnect region 120 is continuous over the substrate 110 as well as the TWT 150. Metal layers and vias of the interconnect region 120 interconnect various semiconductor structures within the substrate 110 (e.g., transistors, capacitors, resistors, diodes, etc.). A portion of the antenna 160 is provided by the interconnect region 120. In the example of FIG. 1, the antenna 160 includes a metal transmit patch 161 and a top side reflection ground plane 162, both of which comprise metal structures within the interconnect region. The interconnect region 120 also includes a metal connection path 122 that interconnects circuit 180 to the metal transmit patch 161 of the antenna 160. FIG. 1 also illustrates an example radiation pattern 163 of the antenna 160. The shape of the radiation pattern can be configured as desired as described below. A backside-coupled metal patch 124 may be included to help shape the radiation pattern of the antenna 163. The backside-coupled metal patch 124 covers at least some of the area of the trench 150. Other embodiments do not include the backside-coupled metal patch.

The antenna 160 in this example is a back-side radiating antenna in that the electromagnetic energy is radiated out of the substrate through surface 122 opposite the surface of the substrate 110 on which the interconnect region 120 is formed. The antenna 160 can be fabricated on a bulk silicon wafer or on a silicon-on-insulator (SOI) wafer.

Figure 2A:
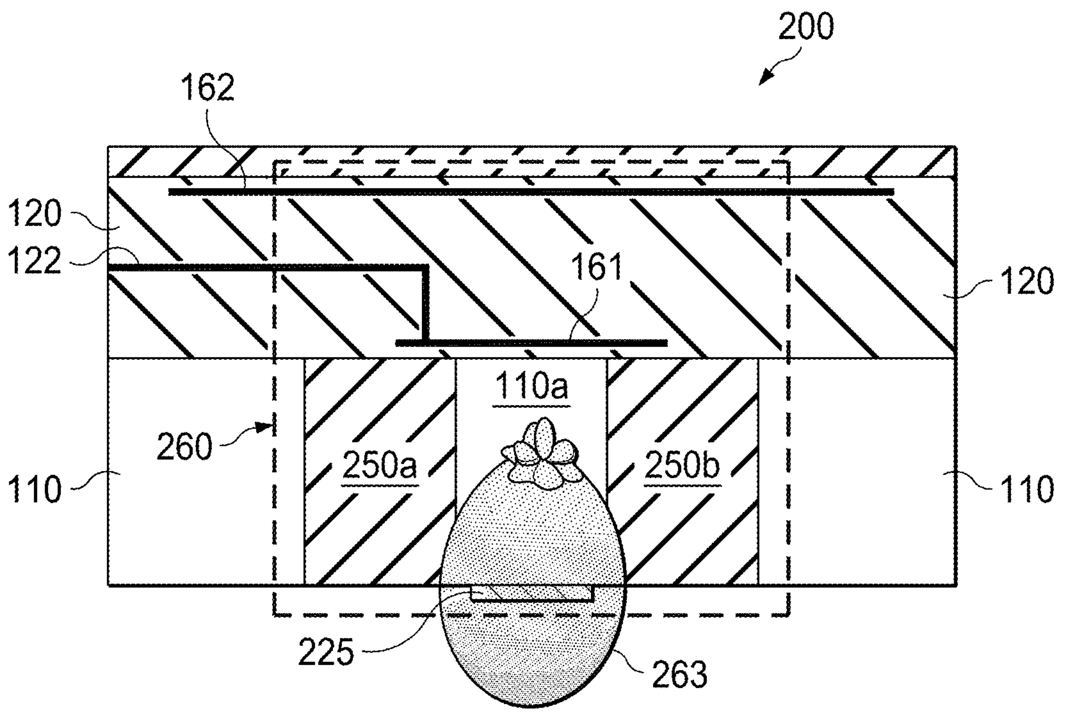
FIG. 2A is a cross-sectional view of an IC including a back-side radiating antenna having multiple dielectric-filled trenches in accordance with another example.
Figure 2B:
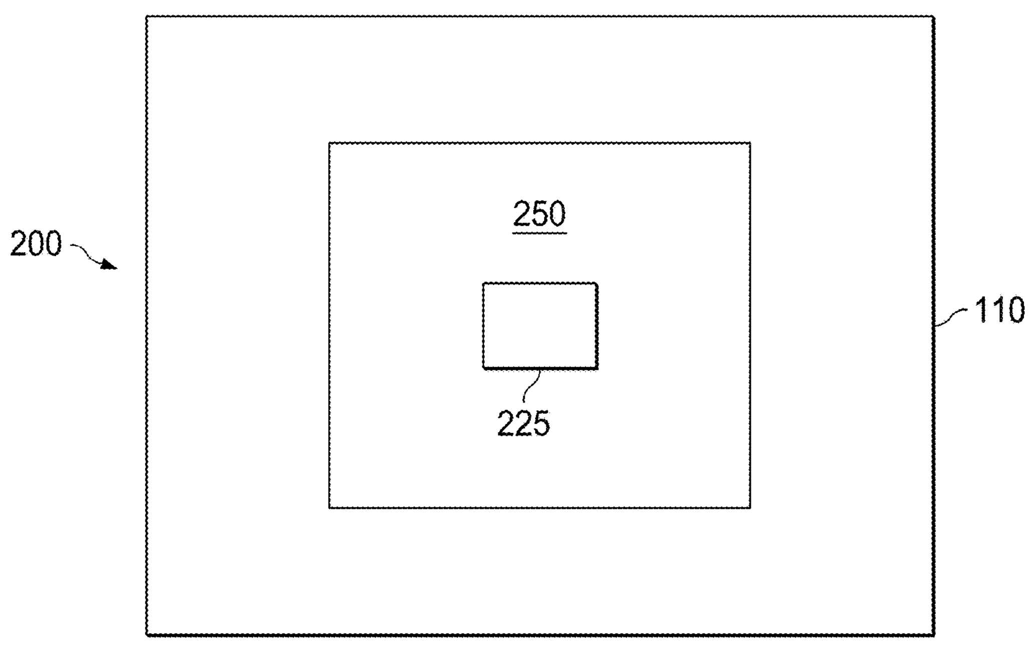
FIG. 2B is a bottom view of the IC of FIG. 2A illustrating a single backside-coupled metal patch in accordance with an example.
Figure 2C:
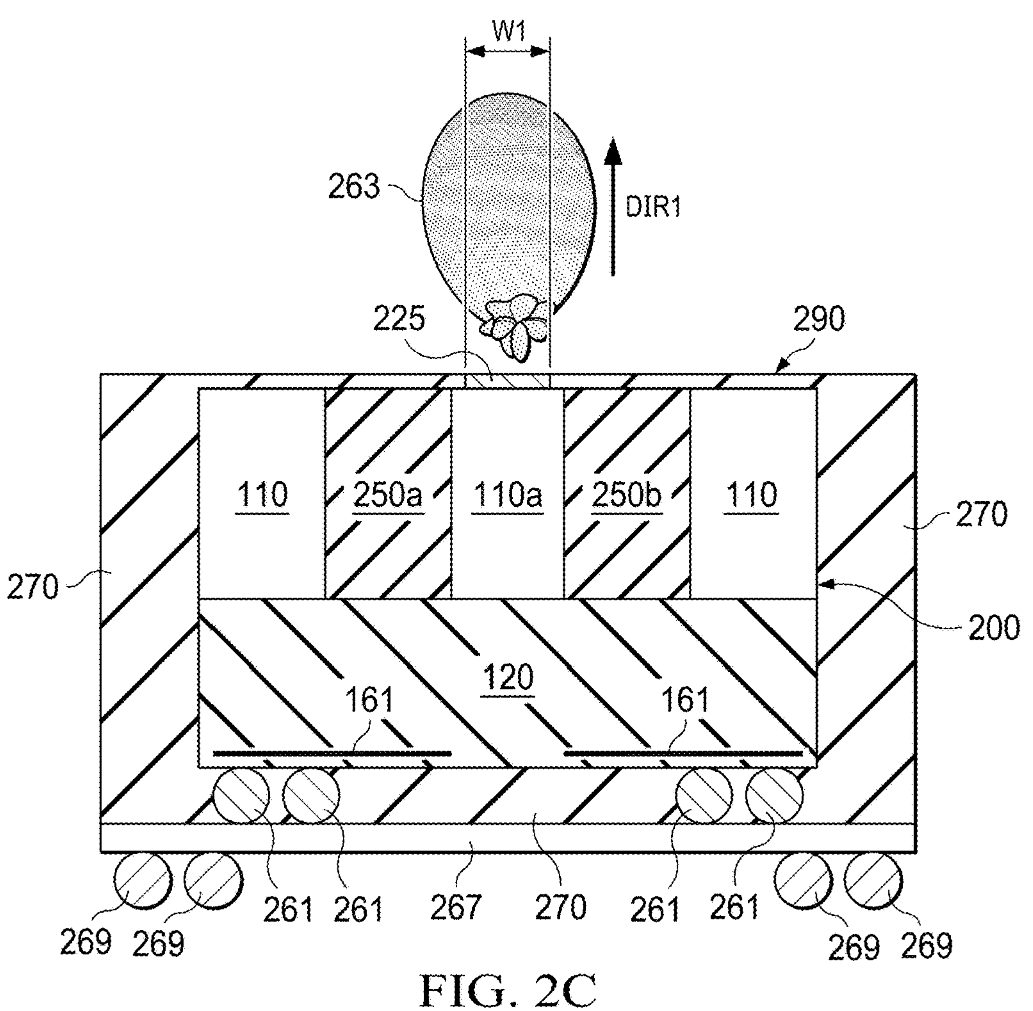
FIG. 2C is a cross-sectional view of the IC of FIG. 2A illustrating its flip-chip configuration.

The shape of the radiation pattern 163 can be customized as desired. In the example of FIGS. 2A-2C, an IC 200 is shown having an antenna 260 that has multiple dielectric-filled (e.g., parylene) trenches 250*a* and 250*b* formed in the semiconductor substrate 110. In this example, the dielectric-filled trenches form a ring (circular, square, etc.) or moat around a silicon substrate island 110*a*. A backside-coupled metal patch 225 helps to shape the radiation pattern of the antenna 260. The backside-coupled metal patch 225 covers most or all of the area of the silicon substrate island 110*a*.

FIG. 2B is a bottom-view of the IC 200 illustrating a dielectric-filled ring 250 (comprising trenches 250*a*, 250*b*, and other trenches to form the ring 250) surrounding the backside-coupled metal patch 225 and underlying silicon substrate island 110*a*. FIG. 2C shows a side view of the IC 200 in a flip-chip configuration. Mold compound 270 encapsulates the IC 200 and solder bumps 261 formed on the interconnect region and thus on the side of the IC opposite the region of the substrate that emits the electromagnetic energy from the antenna. The solder bumps 261 of the IC 200 are soldered onto a package substrate 267 (e.g. a metal leadframe) and solder bumps 269 permit the flip-chip package to be soldered to a circuit board. The radiating pattern 263 is shown. The radiating pattern has a width W1 and direction DIR1.

Figure 3A:
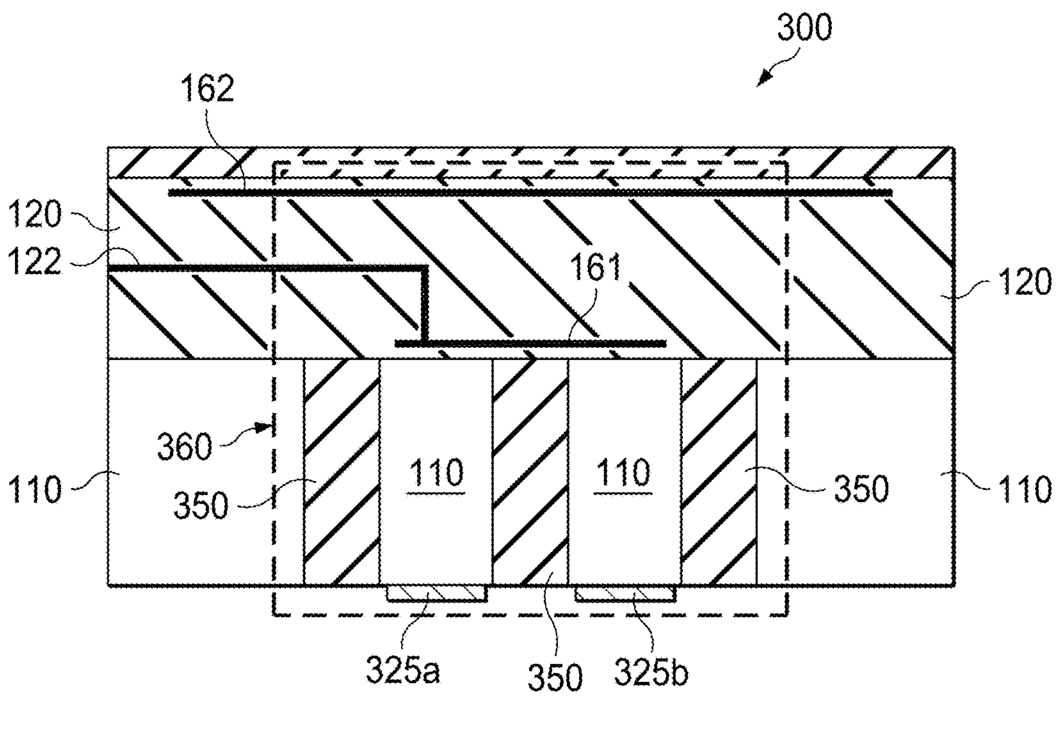
FIG. 3A is a cross-sectional view of an IC including a back-side radiating antenna having multiple dielectric-filled trenches and multiple backside-coupled metal patches for beam steering in accordance with another example.
Figure 3B:
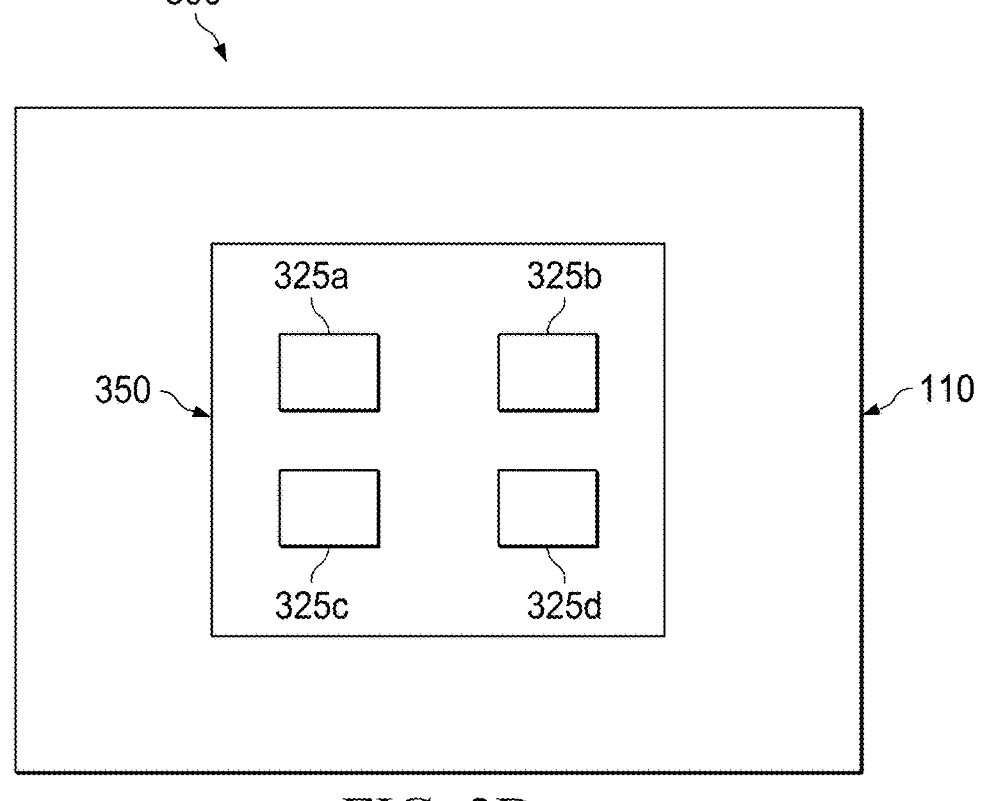
FIG. 3B is a bottom view of the IC of FIG. 3A illustrating multiple backside-coupled metal patches in accordance with an example.
Figure 3C:
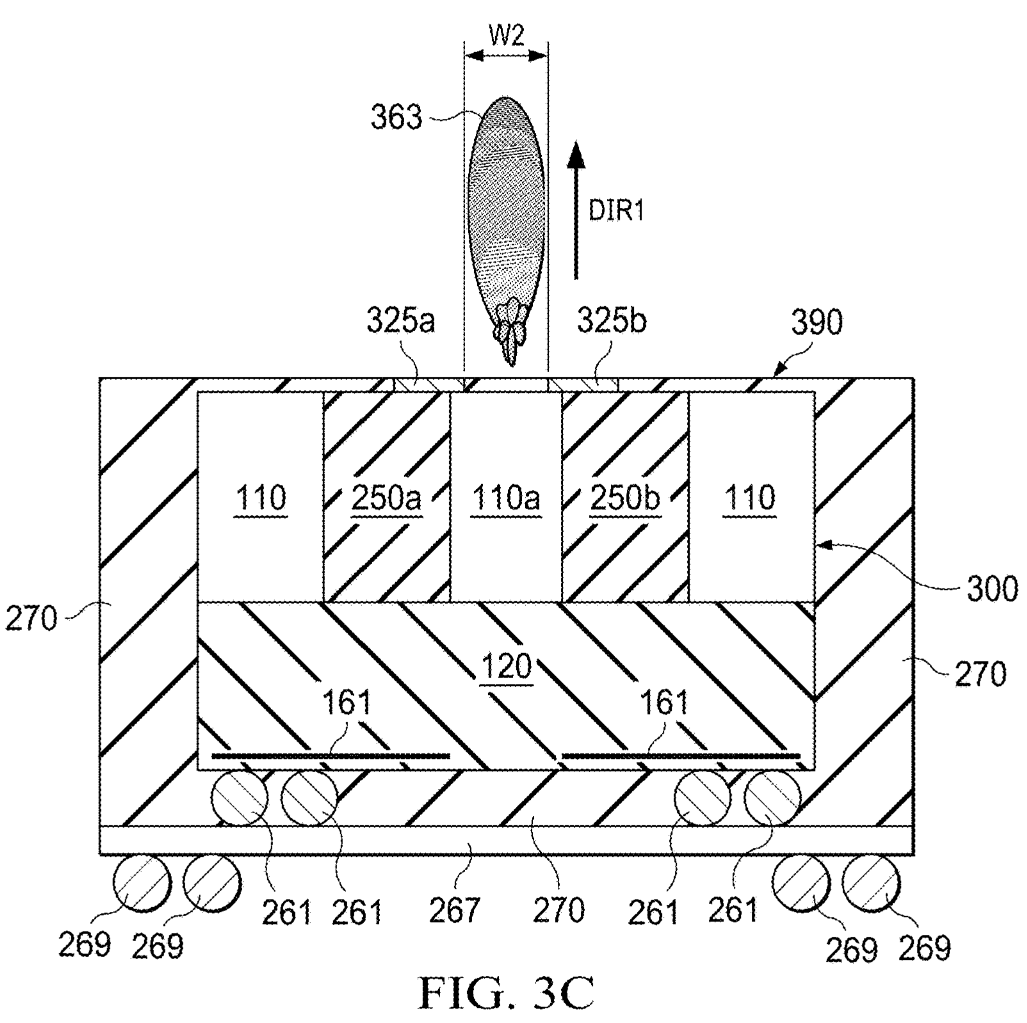
FIG. 3C is a cross-sectional view of the IC of FIG. 3A illustrating its flip-chip configuration and having a narrower radiation beam than that of the example of FIGS. 2A-2C.

FIGS. 3A-3C show an alternative embodiment of an IC 300 in which antenna 360 includes multiple dielectric-filled trenches 350 and silicon substrate islands therebetween. Multiple backside-coupled metal patches 325*a*-325*b* are provided for beam steering purposes. FIG. 3B illustrates that backside-coupled metal patches 325*a*-325*d* are provided in an array on the backside of the IC 300. FIG. 3C shows that the resulting radiation pattern 363 as a width W2 that is narrower than the width W1 of FIG. 2C due to enhanced directivity relative to the embodiment of FIG. 2. By spacing the antenna elements and suitably exciting them, the beam constructively adds in one direction while reducing its content in other directions.

In one embodiment, the direction DIR1 of the radiation pattern is normal to the plane of the IC. In other embodiments, the direction of the radiation pattern can be at an angle other than 90 degrees from the plane of the IC, thus steered as desired.

In one example, the antennas 160, 260, and 360 described herein can radiate energy into (or receive energy from) free space (e.g., air). In another example, a waveguide (not shown) can be coupled to the surface of the substrate at which the antenna is located, and electromagnetic signals can be transmitted between the antenna and the waveguide.

Figure 4:
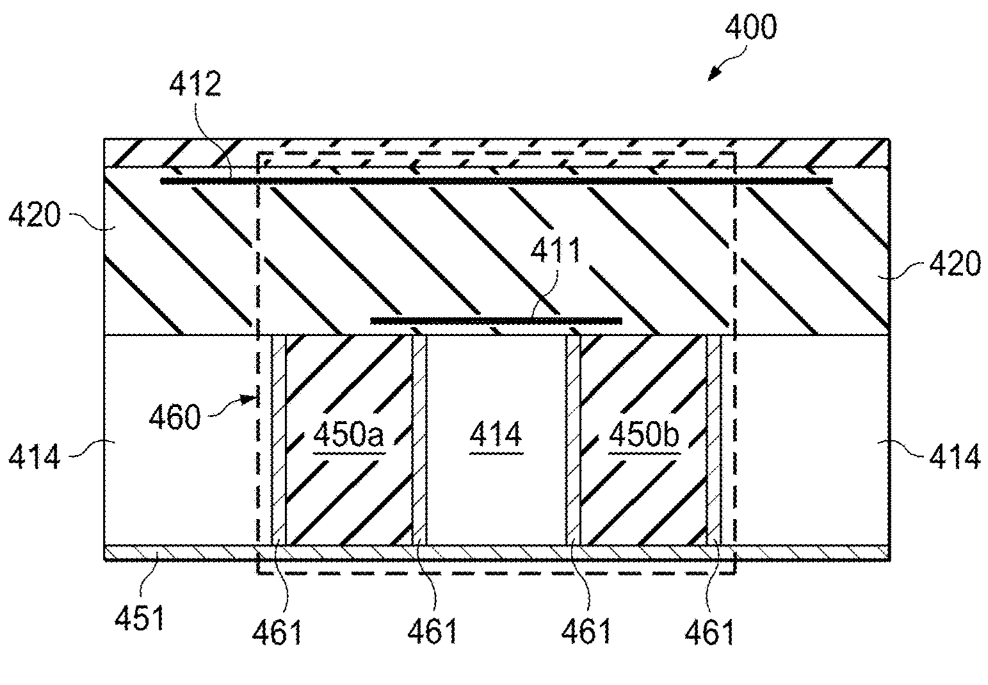
FIG. 4 is a cross-sectional view of an IC that includes a dielectric resonator in accordance with an example.

FIG. 4 is an IC 400 that includes a dielectric resonator 460 in accordance with an example. The resonator 460 includes a resonant cavity 414 formed in a silicon substrate and including multiple dielectric-filled trenches 450*a* and 450*b*. The trenches 450*a* and 450*b* may be filled with any of the materials mentioned above. In one example, the trenches are filled with Parylene. As a resonant cavity, an RF signal injected into the cavity at the resonant frequency of the cavity cause the electromagnetic waves to reinforce. The sides of the trenches 450*a* and 450*b* may be lined with a metal 461. The metal-lined trenches may be particularly helpful to form a satisfactorily performing resonator depending on the conductivity level of the silicon substrate. For example, if the conductivity of the silicon substrate is low enough, the resonator's performance will benefit from having metal 461 line trenches (forming an interface between silicon and the dielectric (Parylene)). A metal layer 4510 is formed across the lower surface of the substrate to facilitate trapping the energy in the resonant cavity. The resonator of FIG. 4 also includes an interconnect region 420 which is an excitation structure coupled to the resonant cavity 414. The excitation structure includes a transmission line 412 to transfer energy into or out of the resonant cavity and a metal structure 411 generally parallel to the transition line 412. The resonator 400 may be a single-port or multi-port resonator, and may function as a filter (e.g., bandpass filter, band-stop filter, etc.). The resonator 400 of FIG. 4 may be encapsulated in mold compound and packaged as any suitable type of package (e.g., a flip-chip package).

The embodiments described herein of an antenna or a resonator include a dielectric-filled trench. The trench is etched from the backside of the wafer. FIGS. 5A-5K illustrate an example process to form the TWT (identified as TWT 508 below) and fill it with a dielectric.

Referring to FIG. 6A, the IC (e.g., IC 100, 200, 300, 400) is formed on a wafer 600 that has a substrate 602 comprising a semiconductor material such as silicon. In this example, the substrate 602 is a bulk semiconductor wafer containing a plurality of ICs. The substrate 602 may include an epitaxial layer of semiconductor material. The IC includes an interconnect region 604 formed at a top surface 606 of the substrate 602. The interconnect region 604 includes layers of dielectric material, one or more levels of metal lines, contacts connecting the metal lines to components in the substrate 602, and vias connecting the metal lines of different levels. In this example, the semiconductor device includes bond pads 116 at, or proximate to, a top surface 618 of the interconnect region 604.

Figure 5A:
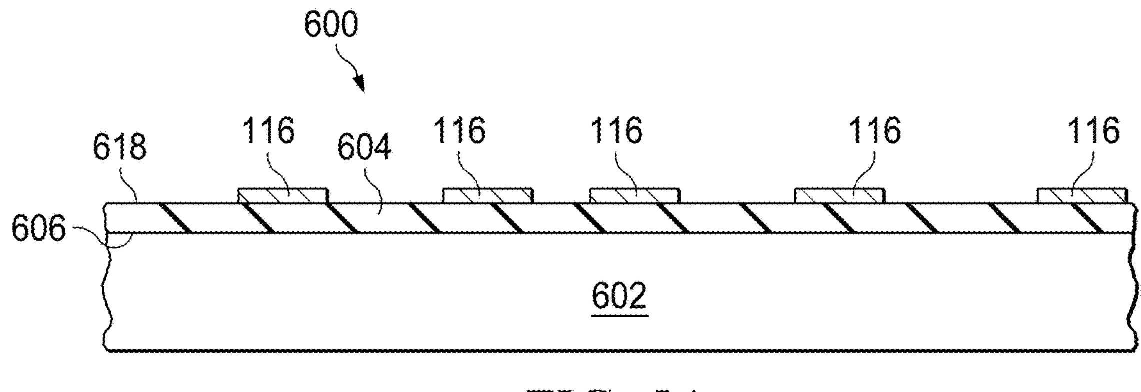
FIGS. 5A-5K are cross-sectional views of a portion of a wafer illustrating process steps for fabrication of a through wafer trench usable to form the antennas and dielectric resonator in accordance with an example.
Figure 5B:
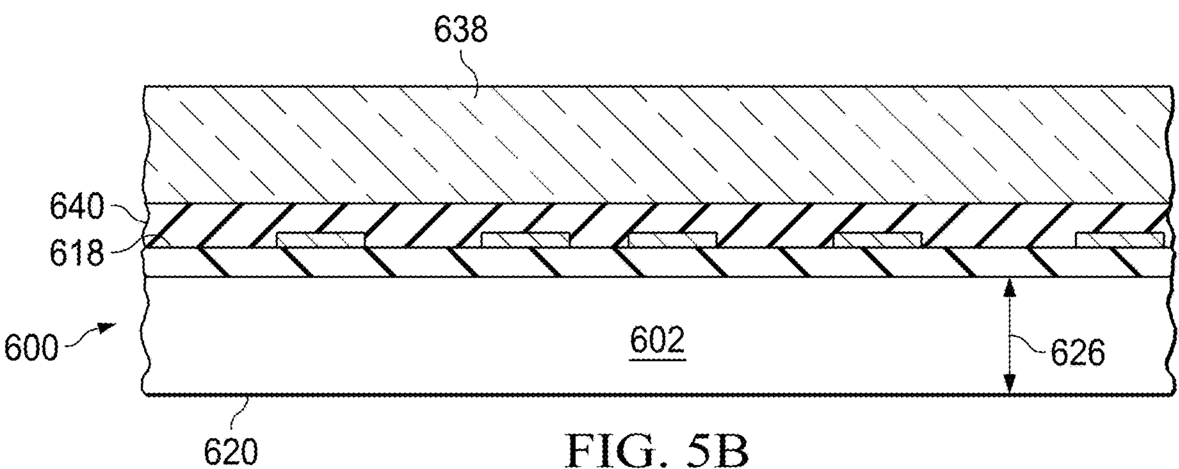

Referring to FIG. 5B, semiconductor wafer 600 is mounted on a carrier 638 with the top surface 618 of the interconnect region 604 nearest the carrier 638 and a bottom surface 620 of the substrate 602 exposed. The carrier 638 may be, for example, a silicon wafer or a ceramic or glass disk. The semiconductor wafer 600 may be mounted to the carrier 638 with a temporary bonding material 640 such as Brewer Science WaferBOND® HT-10.10. A thickness 626 of the substrate 602 may initially be 500 microns to 600 microns, for example a full thickness of a commercial silicon wafer.

Figure 5C:
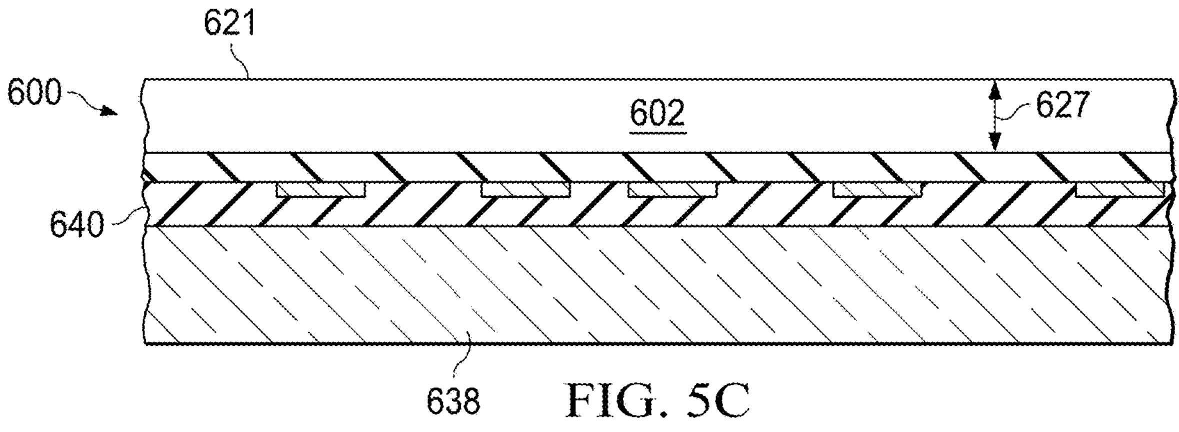

Referring to FIG. 5C, the thickness 527 of substrate 602 is reduced to approximately 100 microns, resulting from thinning the substrate 602, for example by backgrinding. The exposed surface 621 of substrate 602 may then be polished using known or later developed techniques, such as chemical mechanical polishing (CMP). Other values of the thickness 626, 627 of the substrate 602 are within the scope of the instant example.

Figure 5D:
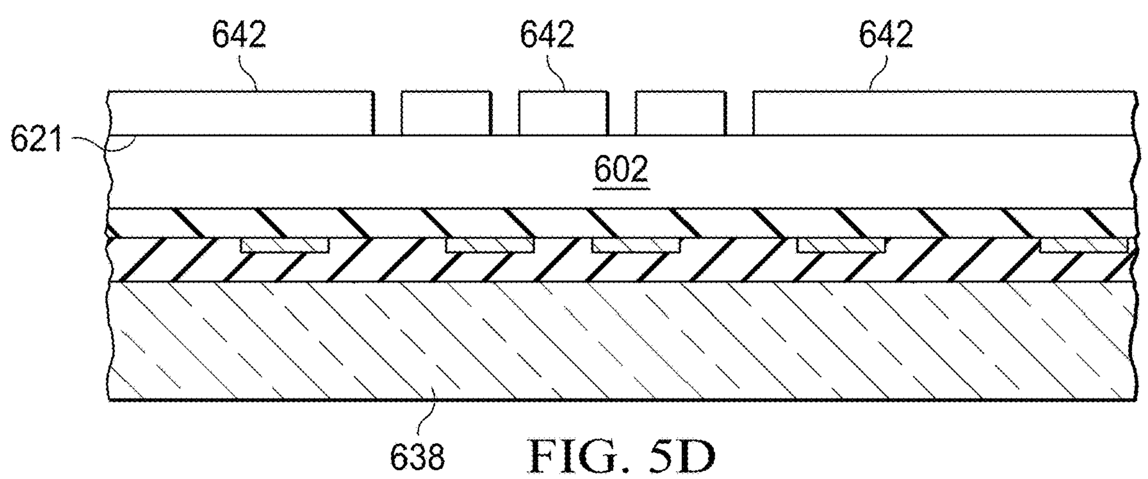

Referring to FIG. 5D, a TWT mask 642 is formed at the bottom surface 621 of the substrate 602 to expose an area for the TWTs. In an example, the TWT mask 642 includes, for example, photoresist formed by a photolithographic process. Forming the TWT mask 642 of photoresist has an advantage of low fabrication cost and may be appropriate for thinned substrates 602. In another example, the TWT mask 642 includes a hard mask material such as silicon nitride, silicon carbide or amorphous carbon, formed by a plasma enhanced chemical vapor deposition (PECVD) process. Forming the TWT mask 642 of hard mask material has an advantage of durability and dimensional stability and may be appropriate for full-thickness substrates 602.

Figure 5E:
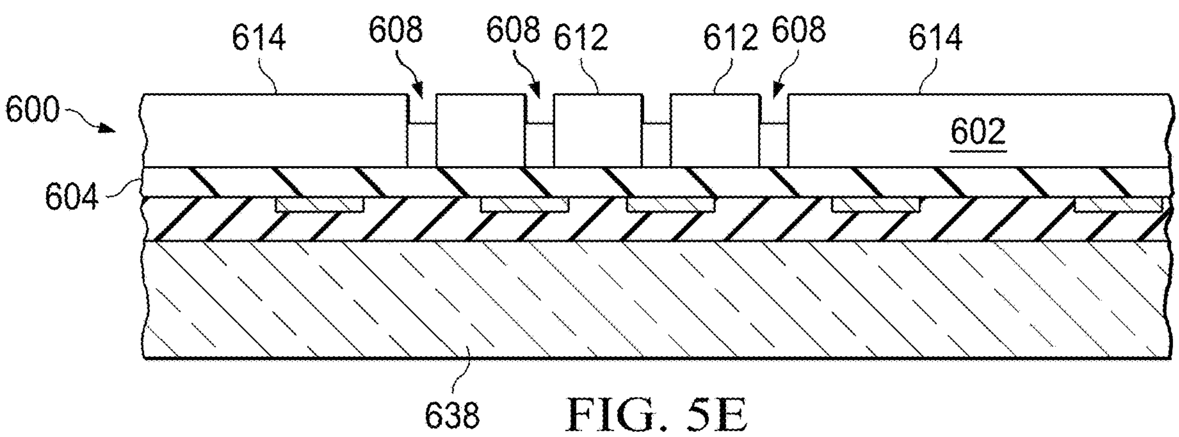

Referring to FIG. 5E, semiconductor material of the substrate 602 is removed in the areas exposed by the TWT mask 642 to form the trenches 650 to subsequently be filled with the dielectric fill material. The semiconductor material of the substrate 602 may be removed by a deep reactive ion etch (DRIE) process. One example of a DRIE process, referred to as the Bosch process, alternately removes material at a bottom of an etched region and passivates sidewalls of the etched region, to maintain a desired profile of the etched region. Another example is a continuous DRIE process which simultaneously alternately removes material at a bottom of an etched region and passivates sidewalls of the etched region. Trenches 650 are formed which extends partially through the substrate 602 towards the interconnect region 604. In the case of bulk-wafer processing (that does not include a silicon-on-insulator (SOI) layer), the etch process automatically stops when it reaches the interconnect region 604. In the case of an SOI process, the etch process automatically stops when it reaches a dielectric layer within the SOI structure.

Referring still to FIG. 5E, the TWT mask 1042 of FIG. 5D is removed. Photoresist in the TWT mask 642 may be removed by an ash process or an ozone etch process, followed by a wet clean process. Hard mask material in the TWT mask 642 may be removed by a plasma etch process which is selective to the semiconductor material in the substrate 602 and the dielectric layers in the interconnect region 604.

Figure 5F:
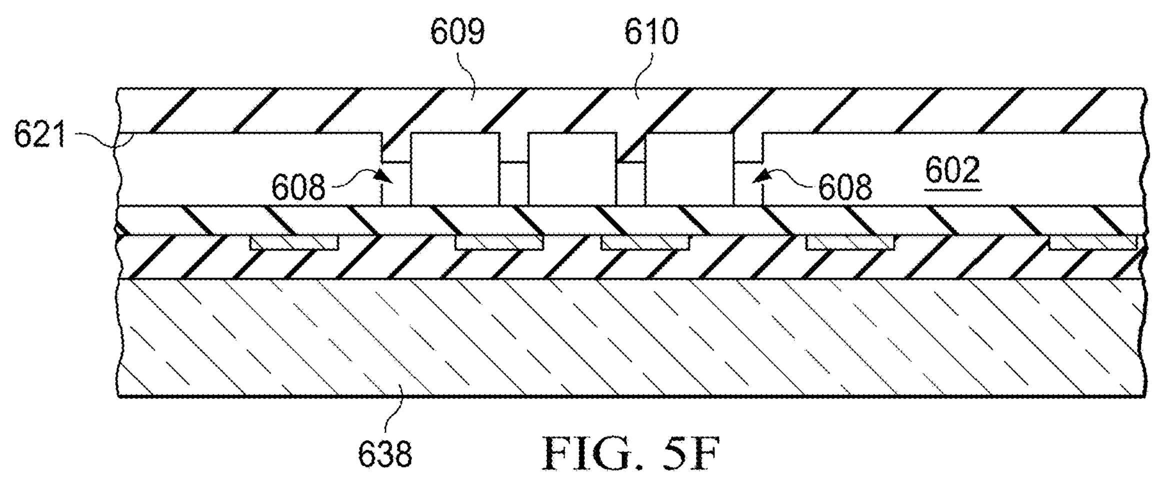

Referring to FIG. 5F, a dielectric polymer 610 is deposited into the TWTs 608 and onto backside surface 621 of substrate 602 to form a backside dielectric polymer layer 1009. In this example, parylene-F is the dielectric polymer 610. In another example, parylene-HT or parylene-AF4 may be used. Parylene's deposition process eliminates the wet deposition method used for other dielectric materials such as epoxy, silicone, or urethane. It begins in a chemical-vacuum chamber, with raw, powdered parylene dimer placed in a loading boat, and inserted into a vaporizer. The dimer is initially heated to between 100 degrees C. to 150 degrees C., converting the solid-state parylene into a gas at the molecular level. The process requires consistent levels of heat; the temperature should increase steadily, ultimately reaching 1080 degrees C., sublimating the vaporous molecules and splitting it into a monomer.

The vaporous molecules are then drawn by vacuum onto substrate 602 in the coating chamber, where the monomer gas reaches a final deposition phase, a cold trap. Here, temperatures are cooled to levels sufficient to remove any residual parylene materials pulled through the coating chamber from the substrate, between −90 degrees and −120 degrees C.

Parylene's complex and specialized vapor-phase deposition technique ensures that the polymer can be successfully applied as a structurally continuous backside dielectric polymer layer 609 while being entirely conformal to the characteristics of TWT region(s) 1080 that are formed in substrate 602.

In another example, TWTs 608 and backside dielectric layer 609 may be formed with other types of dielectric material, such as, for example, fluid droplets containing uncured epoxy, uncured polyimide, uncured BCB, ceramic slurry, sol-gel, siloxane-containing fluid such as methylsilsesquioxane (MSQ), or glass. The dielectric-containing fluid droplets may include solvent or other volatile fluid, which is subsequently removed. The dielectric-containing fluid droplets may include two reactive component fluids, such as epoxy resin and hardener, which are mixed just prior to delivery from a droplet delivery apparatus. The dielectric-containing fluid in the TWTs 608 is cured, dried or otherwise processed, as necessary, to form the dielectric material 610 in the TWTs 608 and backside dielectric layer 609. The semiconductor wafer 600 may be, for example, baked in a vacuum or inert ambient to convert the dielectric-containing fluid into dielectric material 610. Some of these materials can use nano-size particles which will densify at low temperatures. In some cases, a low temperature glass powder might be used and then heated hot enough to melt and hence densify and fill gaps.

Figure 5G:
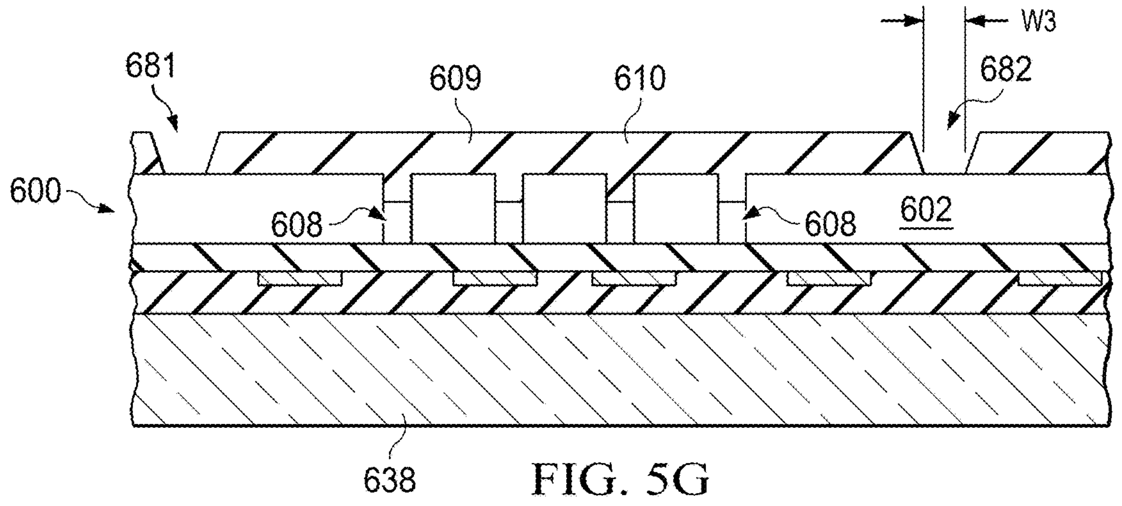

Referring to FIG. 5G, backside dielectric polymer layer 609 is processed to remove the parylene from cut-line regions 681, 682 that will be sawn or otherwise cut to separate the various ICs on the wafer from each other. One reason to remove the parylene from the cut line regions is to keep it from interfering with the cutting process. Another reason is to allow a diffusion barrier 611 (see FIG. 5H) to be placed on the backside dielectric layer 609 that will not expose parylene backside layer 609 by the cutting process. In this example, the edges of backside dielectric layer 609 at cut-line regions 681, 682 are tapered slightly to allow a smooth deposition of diffusion barrier layer 611 (FIG. 5H).

Referring still to FIG. 5G, in one example a thick photoresist formed by a photolithographic process and a polymer etch using oxygen is used to remove the parylene from cut lines 681, 682. In another example, a hard mask material such as silicon nitride, silicon carbide or amorphous carbon formed by a plasma enhanced chemical vapor deposition (PECVD) process is used to remove parylene from cut line regions 681, 682. In another example, a laser ablation process is used to remove parylene from cut line regions 681, 682.

Figure 5H:
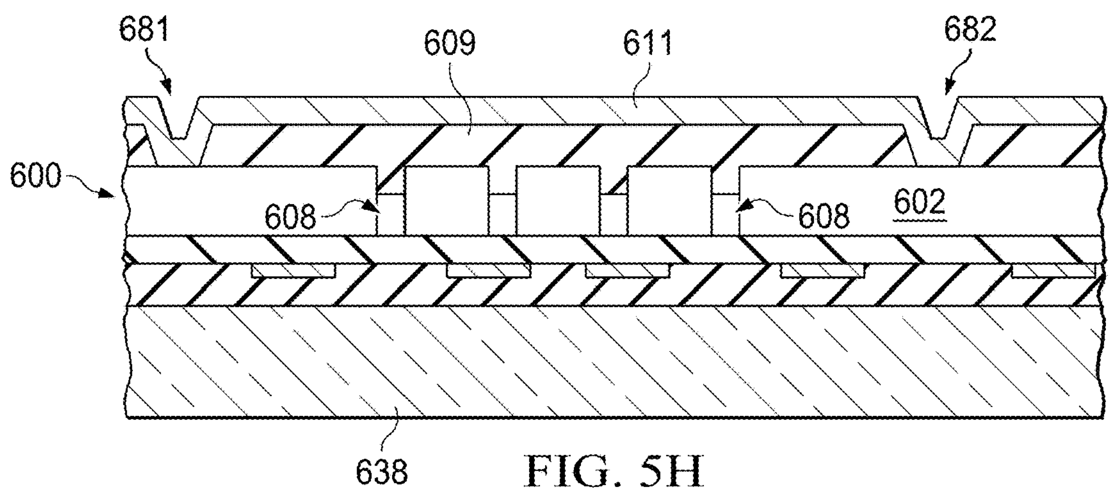

Referring to FIG. 5H, a diffusion barrier layer 611 is deposited over backside dielectric polymer layer 609. In one example, diffusion barrier layer 611 is a layer of SiN that is thick enough such that the CTE mismatch with parylene layer 609 does not crack diffusion barrier 611. In another example, diffusion layer 611 is a metal diffusion barrier. Some examples of typical interconnect or packaging metals include Ta, Ti, TiW, TaN, TiN, Al, Cu, Ag, or Au. In this case, copper (Cu), for example, is electroplated onto an adhesion layer Cu seed layer on top of a titanium (Ti) or titanium tungsten (TiW) barrier layer using a sputter, e-beam, CVD or later developed plating technique. In some examples, a pattern may be used to deposit thick Cu only in areas of dielectric polymer layer 609 that need to be protected from moisture absorption.

Prior to depositing diffusion barrier 611, parylene 610 is baked to remove any latent moisture and to densify the parylene. Removing moisture from parylene may improve its resistivity by a factor of, for example, 100 times. The resistivity of the parylene typically requires lower temperatures for long times (such as 250 degrees C. for 24 hour) or higher temperatures for short times (400 degrees C. for 1 hour). Further baking typically improves the resistivity although too much baking especially in oxygen environments may result in degradation. After baking, diffusion barrier 611 should be applied in a timely manner to prevent diffusion of moisture back into the parylene 610.

Figure 5I:
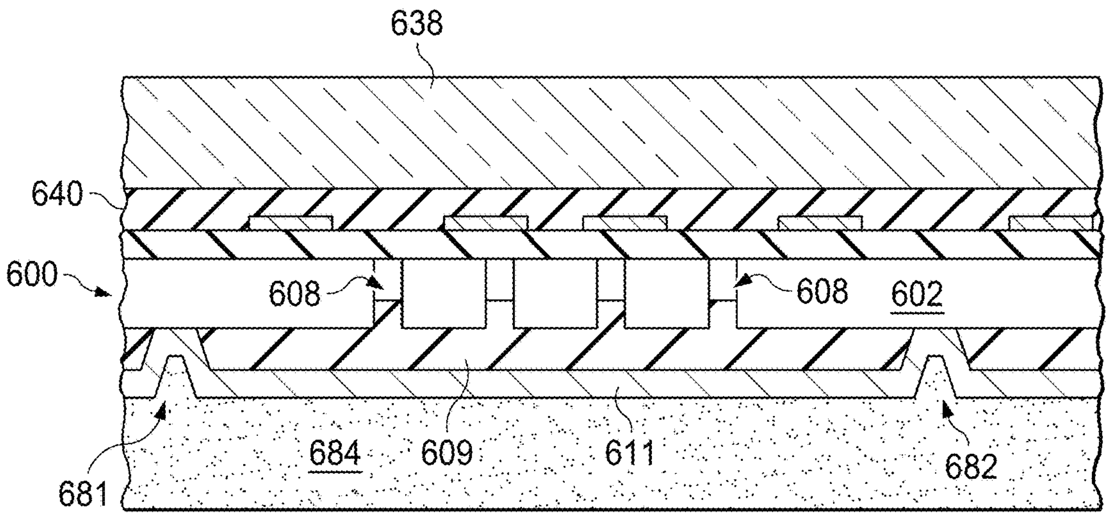

Referring to FIG. 5I, semiconductor wafer 600 is mounted on tape 684 to provide support while carrier 638 is removed. Tape 684 is a known or later developed tape that is used in the fabrication of ICs.

Figure 5J:
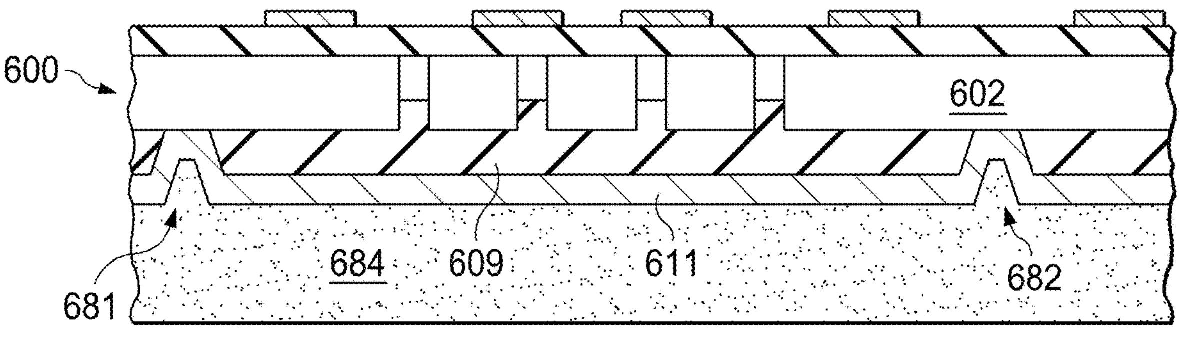

Referring to FIG. 5J, semiconductor wafer 600 is removed from the carrier 638 of FIG. 5I. The semiconductor wafer 600 may be removed, for example, by heating the temporary bonding material 640 of FIG. 5I to soften the temporary bonding material 640 using a laser or other heat source, and laterally sliding the semiconductor wafer 600 off the carrier 638. The temporary bonding material 640 is subsequently removed, for example by dissolving in an organic solvent.

Figure 5K:
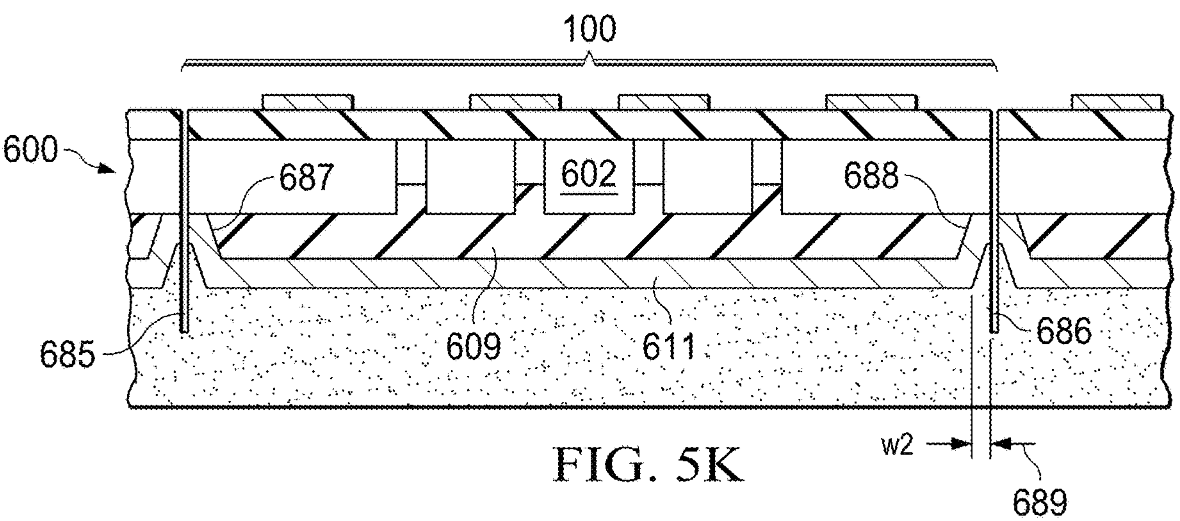

Referring to FIG. 5K, the multiple ICs included on semiconductor wafer 600 are singulated as indicated at example cut lines 685, 686 using known or later developed singulation techniques, such as mechanical sawing, laser cutting, etc. Many additional cut lines (not shown) are formed to singulate all of the semiconductor devices that were fabricated in parallel on wafer 600.

Referring still to FIG. 5K, edges of backside dielectric polymer 687, 688 are not exposed by the singulation process and diffusion barrier 611 remains intact to completely seal and protect backside dielectric layer 609 due to the removal of a portion of the backside dielectric layer 609 in cutline region 681, 682 (FIG. 10G) prior to deposition of diffusion barrier 611. Referring to FIG. 5G, the portion of parylene that is removed from cut-line region 681, 682 has a width w1 that is wide enough so that after diffusion barrier layer 611 is applied, there is still a space 689 having a width W3 between the edge of backside dielectric layer 609 and the peripheral edge substrate 602 of the IC that is wide enough so that edges 687, 688 of backside dielectric polymer layer 609 are not exposed by the singulation process. Referring still to FIG. 5K, each of the multiple semiconductor devices are then packaged using known or later developed IC packaging techniques.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, "about," "approximately," or "substantially" preceding a parameter means +/−10 percent of the stated parameter.

Modifications are possible in the described embodiments, and other embodiments are possible, within the scope of the claims.

What is claimed is:

1. An integrated circuit (IC), comprising:

a substrate having a first surface and a second surface opposite the first surface;

a trench extending from the first surface of the substrate to the second surface of the substrate;

a dielectric material in the trench; and a metal layer over the first surface and at least partially overlapping with the trench; and a circuit electrically coupled to the metal layer, the circuit configurable to transmit or receive a signal via the metal layer and the trench.

2. The IC of claim 1, wherein the metal layer is a first metal layer, and the IC includes a second metal layer overlapping at least partially with a surface of the dielectric material adjacent to the second surface.

3. The IC of claim 1, wherein the metal layer is a first metal layer, and the IC includes a second metal layer electrically coupled to the circuit, and the circuit is configurable to transmit or receive the signal via the first and second metal layer.

4. The IC of claim 1, wherein the trench is a first trench, and the substrate includes multiple trenches including the first trench, each of the multiple trenches is filled with the dielectric material.

5. The IC of claim 4, wherein the multiple trenches form a ring.

6. The IC of claim 1, further comprising an interconnect region over the first surface, wherein the metal layer is in the interconnection region, and the IC further comprises:

a package substrate;

first metal interconnects coupled between the interconnect region and the package substrate;

a mold compound covering at least part of the substrate, the interconnect region, the first metal interconnects, and the package substrate; and second metal interconnects on a surface of the package substrate external to the mold compound.

7. The IC of claim 6, further comprising a dielectric layer covering the interconnect region.

8. The IC of claim 1, wherein the dielectric material is a parylene compound.

9. The IC of claim 1, wherein the dielectric material is a fluorinated parylene compound.

10. The IC of claim 1, wherein the trench has a width in a range of 3-50 microns parallel with the first or second surfaces.

11. The IC of claim 1, wherein the metal layer is a first metal layer, and the IC further comprises a second metal layer over the first surface, and the first metal layer is between the second metal layer and at least one of the trench or the first surface, the second metal layer configurable as a reflector or a ground plane.

12. The IC of claim 1, further comprising a dielectric layer covering the first surface.

13. The IC of claim 1, wherein the substrate is a semiconductor substrate, and the circuit is in the semiconductor substrate.

14. An integrated circuit (IC), comprising:

a substrate having a first surface and a second surface opposite the first surface;

a first trench and a second trench extending between the first and second surfaces;

a dielectric material in the first trench and in the second trench;

a metal layer over the first surface and overlapping at least partially with at least one of the first or second trenches; and a circuit coupled to the metal layer, the circuit configured to transmit or receive a signal via the metal layer and the at least one of the first or second trenches.

15. The IC of claim 14, wherein the metal layer is a first metal layer, and the IC includes a second metal layer on the second surface of the substrate between the first and second trenches.

16. The IC of claim 14, wherein the metal layer is a first metal layer over the first trench, and the IC includes a second metal layer electrically coupled to the circuit and over the second trench, and the circuit is configurable to transmit or receive the signal via the first and second metal layer.

17. The IC of claim 14, further comprising an interconnect region over the first surface, the metal layer being in the interconnect region, and the IC further comprises:

a package substrate;

first metal interconnects coupled between the interconnect region and the package substrate;

a mold compound covering at least part of the substrate, the interconnect region, the first metal interconnects, and the package substrate; and second metal interconnects on a surface of the package substrate external to the mold compound.

18. The IC of claim 14, wherein the dielectric material is a parylene compound.

19. The IC of claim 14, wherein the dielectric material is a fluorinated parylene compound.

20. The IC of claim 14, wherein at least one of the first trench or the second trench has a width in a range of 3-50 microns along the first or second surfaces of the substrate.

21. The IC of claim 14, wherein the metal layer is a first metal layer, and the IC further comprises a second metal layer over the first surface, and the first metal layer is between the second metal layer and the first surface, the second metal layer configurable as a reflector or a ground plane.

22. An integrated circuit (IC), comprising:

a substrate having a first surface and a second surface opposite the first surface;

a trench extending between the first and second surfaces;

a dielectric material in the trench; and a metal layer on the second surface and overlapping at least a portion of the dielectric material.

23. The IC of claim 22, wherein the metal layer is a first metal layer, and the IC further comprises a second metal layer covering internal surfaces of the trench.

24. The IC of claim 22, wherein the trench is a first trench, and the substrate includes a second trench filled with the dielectric material.

25. The IC of claim 24, wherein the trench.

26. The IC of claim 25, wherein the first and second trenches are part of or form a resonant cavity.

27. The IC of claim 25, further comprising two parallel metal structures over the first surface.

28. The IC of claim 22, further comprising interconnect region over the first surface, wherein the metal layer is a first metal layer, and the IC further comprises:

a package substrate;

first metal interconnects coupled between the interconnect region and the package substrate;

a mold compound covering at least part of the substrate, the interconnect region, the first metal interconnects, and the package substrate; and second metal interconnects on a surface of the package substrate external to the mold compound.

29. The IC of claim 22, wherein the dielectric material includes a parylene compound.

30. The IC of claim 22, wherein the metal layer is a first metal layer, and the IC further comprises a second metal layer over the first surface, and the first metal layer is between the second material layer and at least one of the trench or the first surface, the second metal layer configurable as a transmission line to transfer energy into or out a resonant cavity including the trench and the substrate.

* * * * *